United States Patent

Wilkinson

[11] 3,946,344
[45] Mar. 23, 1976

[54] PUSH-BUTTON TUNING MECHANISM
[75] Inventor: Alfred Wilkinson, Ringwood, England
[73] Assignee: Sydney S. Bird and Sons Limited, Dorset, England
[22] Filed: Nov. 12, 1974
[21] Appl. No.: 523,090

[52] U.S. Cl. .................. 334/7; 74/10.33; 74/10.37; 74/10.6
[51] Int. Cl.[2] .......................................... H03J 5/12
[58] Field of Search ............ 334/7; 74/10.33, 10.35, 74/10.37, 10.6

[56] References Cited
UNITED STATES PATENTS

| | | | |
|---|---|---|---|
| 2,253,433 | 8/1941 | Kellogg | 74/10.37 |
| 2,310,003 | 2/1943 | Wells | 74/10.33 |
| 2,344,091 | 3/1944 | Kirk | 334/7 |
| 3,602,051 | 8/1971 | Olah | 334/7 |

Primary Examiner—Alfred E. Smith
Assistant Examiner—Wm. H. Punter
Attorney, Agent, or Firm—Seidel, Gonda & Goldhammer

[57] ABSTRACT

A push-button, press-to-lock tuner mechanism for an automobile radio receiver or the like has the conventional treadle bar replaced by an elongate, flat metal strip substantially rectilinearly movable along its longitudinal axis. Cams on push rods operated by push-buttons co-operate with like members pivoted to the strip to move it to preset tuning positions. The aforesaid and other parts of the mechanism are all flat and substantially coplanar so that the height of the mechanism is much less than the limit prescribed by the DIN specification, thus permitting a tape player to be stacked with the tuner mechanism with the combined unit having a height no greater than the specified DIN limit.

15 Claims, 13 Drawing Figures

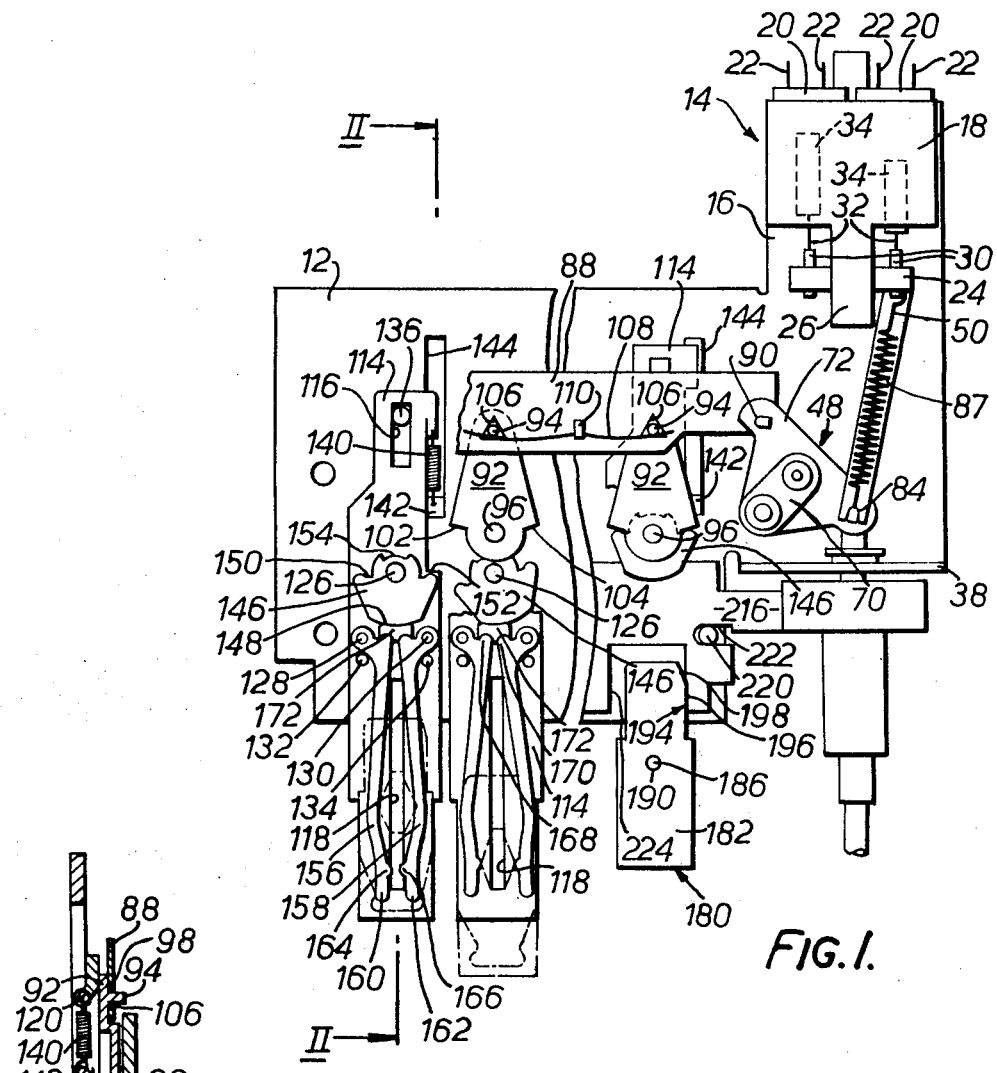
FIG. 1.
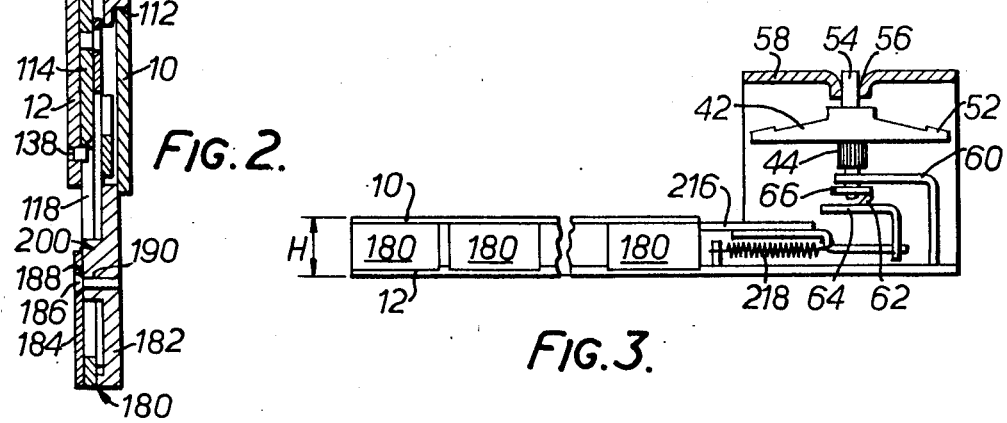
FIG. 2.
FIG. 3.

PUSH-BUTTON TUNING MECHANISM

BACKGROUND OF THE INVENTION

1. Field of the Invention

This invention relates to tuner mechanisms, more particularly to tuner mechanisms of the type known as "push button, press-to-lock" tuner mechanisms.

2. Description of the Prior Art

A known push button, press-to-lock tuner mechanism includes reactive circuit components, e.g. an assembly of coils, the reactances of which are altered to vary the frequency of tuned circuits in an associated radio receiver, e.g. an automobile radio receiver, to enable selection of a desired wavelength. The reactances are mechanically varied, in the case of the coils the inductances being varied by moving ferromagnetic cores into and out of the coils. The tuner mechanism includes means for infinitely varying the inductances, such means comprising a tuning spindle protruding through a control panel of the mechanism and minimal-backlash transmission means interconnecting the spindle and cores and arranged to move the cores into and out of the coils with rotation of the tuning spindle.

The known mechanism also includes a member known as a "treadle bar". The treadle bar may comprise two like rods of equal diameter which are spaced apart by (and attached to) end plates to form an elongate rectangular structure mounted so that its longitudinal axis is horizontal and so that it is pivotable about such axis. Rotation of the treadle bar about this axis gives a range of angular positions to the rods on either side of a central position in which the rods lie in a vertical plane. The treadle bar is connected to or forms part of said transmission means so that it is rotated about its longitudinal axis with roation of the tuning spindle.

A plurality of push buttons are also provided, each for enabling the user to select a respective, associated wavelength merely by pressing the button, i.e. without rotating the tuning spindle. Each button is provided with an actuating member having a cam thereon. When the button is pushed inwardly from a rest position towards which the associated actuating member is bi-assed, a pair of surfaces on the cam contact the rods of the treadle bar and rotate the treadle bar about its axis to a position determined by the orientation of the cam, and therefore move the ferromagnetic cores to corresponding positions.

The actuating members and push buttons are arranged so that the wavelength or frequency selected by pushing each button can be selected at will. To change the wavelength selected by pushing any one button, the new wavelength is selected by using the tuning spindle. The button is then pulled outwardly of the rest position i.e. outwardly with respect to the associated actuating member, thereby freeing the associated cam to rotate. The button is then pushed inwardly past the rest position. The cam contacts the treadle bar and, since the cam is free to rotate, it adopts a position determined by the position of the treadle bar, which position was set by using the tuning spindle. The cam and actuating member are then held stationary by abutment with the treadle bar and further inward pressure on the button therefore causes the button to move back inwardly with respect to the acutating member to its original position, thereby locking the cam in its new position. Consequently, whenever the button is subsequently used, it moves the treadle bar to the position which was selected by movement of the tuning spindle to select the desired wavelength.

The above-described type of tuner mechanism is subject to the disadvantage that, since it employs a treadle bar mounted and arranged as described, it must be at least high enough to accommodate the treadle bar when it lies in a vertical plane.

SUMMARY OF THE INVENTION

According to the present invention, a tuner mechanism comprises at least one reactance element, a manually operable tuning control, transmission means interconnecting the reactance element and the tuning control whereby the reactance of the element is varied by operation of the tuning control, a movable member connected to the transmission means and arrranged to be translationally moved by operation of the tuning control, at least one actuating member arranged for movement towards and away from said movable member, cam means associated with the actuating member, and means for adjusting the orientation of the cam means, the cam means being arranged to interact with the movable member on movement of the actuating member towards the movable member to translationally move the movable member to a position determined by the orientation of the cam means.

In the present invention, the pivoted treadle-bar of the prior art arrangement is replaced by a translationally movable member. This invention leads to a number of advantages. First, the movable member can be a simple stamping rather than a die-casting, thereby simplifying and cheapening production. Second, and as explained in more detail below, the overall height of the mechanism can be greatly reduced. The height can, in fact, be reduced to such an extent that a stereo tape player can be accommodated above the tuner mechanism, the height of the combined unit satisfying the requirements of the appropriate DIN specification. As is known to those skilled in the art, DIN is the abbreviation for Deutsche Industrie Normen, literally meaning the German Industrial Standards. DIN Specification No. 75,500, for example, published in Deutsche Normen, July 1970 by Beuth-Vertrieb GmbH, Berlin describes the space required for radio sets in motor vehicles. In contrast, the prior art tuner mechanism is so high that it takes up by itself the specified height allowance, so that any associated tape player must be mounted in a separate fitting aperture, or any combined unit will exceed the height prescribed by the DIN specification.

BRIEF DESCRIPTION OF THE DRAWINGS

The invention will be more readily understood from the following description, given by way of example only, of a tuner mechanism in accordance with the invention, reference being made to the accompanying drawings, in which:

FIG. 1 is a top plan view of the tuner mechanism with some parts omitted and other parts simplified for clarity of illustration;

FIG. 2 is a cross-section through the tuner mechanism taken along the line II—II in FIG. 1;

FIG. 3 is a front view of the tuner mechanism with some parts omitted and other parts simplified for clarity of illustration;

DETAILED DESCRIPTION OF THE PREFERRED EMBODIMENT

Figure 4:
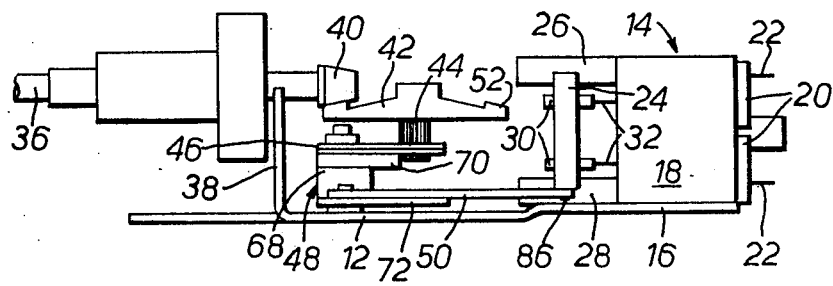
FIG. 4 is a side view of the tuner mechanism, taken from the right of FIGS. 1 and 2, with some parts omitted and other parts simplified for clarity of illustration.

The illustrated tuner mechanism is provided with a frame comprising upper and lower plates 10 and 12, respectively, secured together by means not shown.

A tuner assembly 14 is mounted on a rearward extension 16 of the lower plate 12. The tuner assembly 14 comprises a rectangular section coil housing 18 which houses four tuner coils 20. The terminations of the coil 20 are connected to terminal pins 22, whereby the coils may be wired to form parts of tuned circuits of a superheterodyne radio receiver (not shown) associated with the tuner mechanism.

A rectangular carriage or guide plate 24 is mounted for linear sliding movement, towards and away from the coil housing 18, between a pair of forward extensions 26, 28 of the coil housing. Threaded plastics members 30, one for each of the coils 20, are threaded into tapped holes within the carriage 24. Extensions 32 from the members 30 connect the members 30 to respective ferromagnetic cores 34. Thus, as the carriage 24 is moved towards and away from the coil housing 18, the cores 34 are moved axially into and out of the coils 20 thereby varying the inductances of the coils and consequently varying the wavelength or frequency to which the associated radio receiver is tuned.

A tuning spindle 36 is mounted to an upwardly-extending portion 38 of the lower plate 12. The tuning spindle 36 extends from the front of the tuner mechanism so that, in use, it can be rotated by a knob (not shown) attached thereto. Minimal backlash transmission means interconnects the tuning spindle 36 and the carriage 24 so that infinitely-variable tuning of the radio receiver can be accomplished by turning the spindle.

The transmission means comprises a friction cone 40 mounted on the rearmost end of the tuning spindle 36, a die-cast drive wheel 42 driven by the friction cone 40, a pinion 44 mounted for rotation with the drive wheel 42, a scissors gear 46 in mesh with the pinion 44, a right-angled crank 48 on which the scissors gear 46 is mounted, and a tie bar 50 connecting together the crank 48 and the carriage 24. The above parts of the transmission means and their operative relationship are described more fully below.

The friction cone 40 (FIG. 4) is an elastomeric sleeve fitted on the rearmost free end of the tuning spindle to provide a frusto-conical high-friction surface. The cone 40 engages the surface of a raised rim 52 of the drive wheel 42, whereby rotation of the tuning spindle 36 causes a corresponding relatively slow rotation of the wheel 42 and the pinion 44. The way in which the drive wheel 42 and the pinion 44 are mounted can best be seen from FIG. 3. The pinion 44 is formed integrally with a shaft 54 and the drive wheel 42 is made fast to the shaft. The shaft 54 is guided for rotation about a vertical axis by a swaged hole 56 in a part 58 of the frame and by a hole in a further part 60 of the frame. A lug 62 projecting from a clutch lever 64 described in more detail below normally abuts a collar 66 on the shaft 54 so as to urge the drive wheel upwardly into engagement with the friction cone 40.

Figure 5:
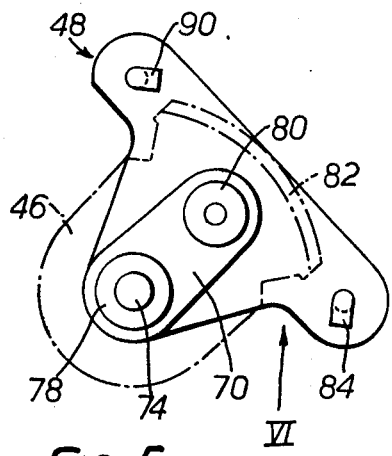
FIG. 5 is a top plan view of a crank forming part of a transmission means of the tuner mechanism, the view showing in phantom a scissors gear, also forming part of the transmission means, fitted to an upper arm of the crank.
Figure 6:
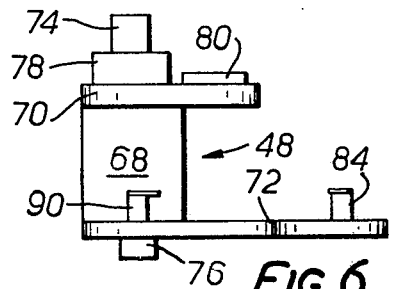
FIG. 6 is a side view of the crank taken from the direction of the arrow VI in FIG. 5.

The crank 48 is a die-casting and is shown in detail in FIGS. 5 and 6. It comprises a vertical column 68 having upper and lower arms 70 and 72, respectively, extending therefrom. Upper and lower bearing pins 74 and 76, respectively, serve to mount the crank 48 for rotation about a vertical axis. A larger diameter portion 78 of the pin 74 and a stud 80 projecting from the upper surface of the upper arm 70 function to secure the scissors gear 46 to the crank 48 in the position shown in FIG. 5. The gear 46 is retained in place on the arm 70 by any suitable retaining means (not shown) such as a screw and/or a circlip.

A scissors gear 46 is a known form of gear used in applications hwere low backlash is required and has been used heretofore in tuner mechanisms. It therefore need not be described in detail. Suffice it to say, for present purposes, that the scissors gear 46 comprises a pair of similar brass sector gears mounted one on top of the other and circumferentially biassed together by a spring whereby the two sets of teeth are urged against the meshing teeth of the pinion 44 in circumferentially opposite directions to virtually eliminate backlash between the teeth of the scissors gear and the teeth of the pinion.

The teeth 82 (FIG. 5) of the scissors gear 46 mesh with those of the pinion 44 whereby rotation of the pinion ratates the scissors gear 46 and therefore also the crank 48. The tie-bar 50 is articulated at one end to the lower arm 72 of the crank 48 by means of a lipped stud 84 formed on the upper surface of the arm 72. The other end of the tie-bar 50 is articulated to the bottom of the carriage 24 by means of a stud 86 (FIG. 4) on the latter. A tension spring 87 is connected between the lipped stud 84 and the underside of the carriage 24 to take out any lost motion, i.e. backlash, from the pivot connections of the tie-bar 50.

From the foregoing it will be seen that, as explained above, there is an exact correspondence between the position of the carriage 24, and therefore the tuned frequency of the radio receiver, and the angular position of the tuning spindle 36.

An elongate, flat connecting strip 88 (FIGS. 1 and 2), stamped from steel plate, is articulated to the crank 48 at right angles to the articulation to the tie-bar 50 by means of a second lipped stud 90 formed on the upper surface of the lower arm 72 of the crank 48, which stud passes through a hole adjacent one end of the strip 88. It will therefore be appreciated that the strip 88 is moved substantially rectilinearly along its longitudinal axis when the tuning spindle 36 is rotated. There is an exact correspondence between, on the one hand, the longitudinal position of the strip 88 and, on the other hand, the position of the carriage 24 and therefore the tuned frequency of the radio receiver.

Figure 7:
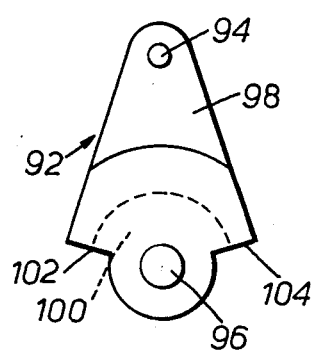
FIG. 7 is a top plan view of a link member provided for each of the push rods of the tuner mechanism.
Figure 8:
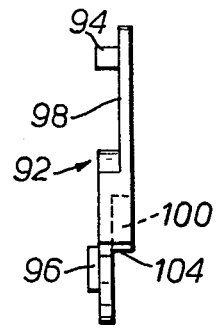
FIG. 8 is a side view of the link member shown in FIG. 7.

As shown in FIG. 1, a plurality of identical link members or pawls 92, each of the form shown in FIGS. 7 and 8, are spaced apart along the length of the strip 88. In the present mechanism, five of the link members 92 are provided. For economy of space, however, two only of the members 92 are illustrated in FIG. 1.

Each link member 92 has a pair of pins 94, 96 formed thereon at opposite ends of the member and both extending upwardly from the upper surface of the member 92. The pin 94 extends upwardly from a recessed portion 98 of the upper surface. The lower surface of the member 92 is recessed at 100 below the pin 96. The front end of the member 92 is configured to form two abutment surfaces or shoulders 102, 104 on opposite sides of the pin 96.

As can be seen from FIGS. 1 and 2, the pins 94 of the link members extend upwardly into respective triangular apertures 106 in the connecting strip 88 and are held in place by a continuous retaining wire spring 108 secured to the strip 88 by engagement with lugs 110 formed on the strip. The recesses 98 in the link members 92, as can best be seen from FIG. 2, permit the link members to be arranged substantially coplanar with the connecting strip 88.

The studs 96 are located in holes in the upper plate 10, one of which holes can be seen at 112 in FIG. 2. Therefore, as the connecting strip 88 is longitudinally moved by operation of the tuning spindle 36, all of the link members 92 follow such movement by pivoting about their studs 96. In addition, it can be seen that the combined action of the crank 48 and the link members 92 function as a means guiding connecting strip 88 for substantially rectilinear translational movement.

Figure 9:
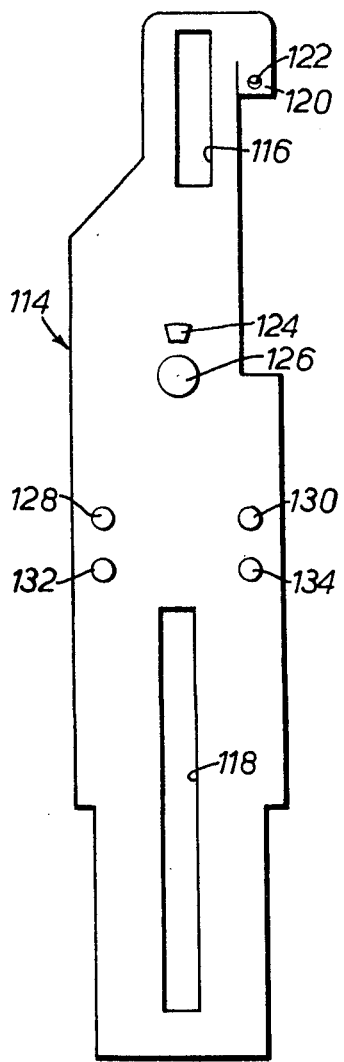
FIG. 9 is a top plan view of one of the push rods used in the tuner mechanism.
Figure 10:
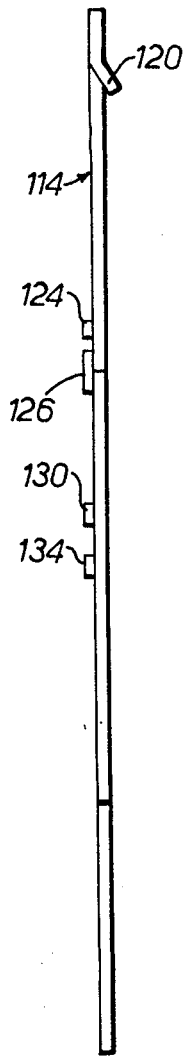
FIG. 10 is a side view of the push rod taken from the right in FIG. 9.

Associated with each of the five link members 92 is an actuating member or push rod 114 of the form shown in FIGS. 9 and 10. Each push rod 114 is an elongate, flat, steel strip having axially directed slots 116, 118 therein near its opposite ends. A downwardly turned lug 120 on each push rod 114 has a hole 122 therethrough. Six studs 124, 126, 128, 130, 132 and 134 are formed on the upper surface of each push rod 114. The stud 124 has a cross-section in the form of a truncated sector, whilst the other five studs are of circular section.

The push rods 114 are mounted to the tuner mechanism so as to be substantially coplanar with the connecting strip 88 and so as to be movable towards and away from the connecting strip in directions perpendicular to the axis of the strip. The push rods 114 are guided in such movement by studs 136 (FIG. 1) and 138 (FIG. 2) which extend from the bottom plate 12 in the slots 116 and 118, respectively. The studs co-operate with the slots to define end positions of movement for the push rods 114. The left hand and central push rods in FIG. 1 are shown in their extreme outer positions, whilst the right hand rod is shown in its extreme inner position. The push rods 114 are biassed towards their outer or rest positions by springs 140 which are connected between the holes 122 in the lugs 120 on the push rods and holes (not shown) in upwardly extending lugs 142 formed at the ends of slots 144 defined in the lower plate 12 and lying parallel to the directions of movement of the push rods.

A flat cam 146 (FIG. 1) is mounted on each of the push rods 114. Each cam 146 is mounted on the stud 126 of the associated push rod 114 so as to be free to rotate about the axis of the stud under certain circumstances explained hereinbelow. At its outer end, each cam 146 is provided with an arcuate edge portion 148. At its inner end, each cam 146 is configured to provide a pair of abutment surfaces or shoulders 150, 152, one on each side of the hole receiving the stud 126. The two circumferentially opposed edges of a recessed edge portion 154 of the inner end of each cam co-operate with the stud 124 (FIG. 9) to define limits of pivotal movement of the cam 146.

Also mounted on each of the push rods 114 are a pair of like, resilient legs 156, 158. The legs are made from steel strip and subsequently hardened and tempered. Each pair of legs 156, 158 are pivoted to the associated push rod 114 by means of the studs 128, 130 on the push rod which extend through holes in the legs. The studs 132, 134 greatly limit the freedom of pivotal movement of the legs and serve as fulcrums when the legs are bowed as described hereinbelow. Each pair of legs 156, 158 extend outwardly along the associated push rod 114, their free ends 160, 162 stopping short of the outer end of the push rod. Projections 164, 166 are formed on the inner edges of the legs 156, 158, respectively, just short of their free ends, the projections confronting one another. A second pair of projections 168, 170 are formed on the edges of the legs 156, 158, respectively near their inner ends.

Figure 11:
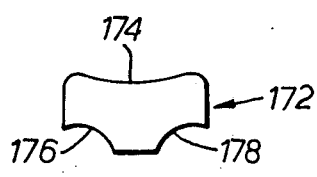
FIG. 11 is a top plan view of a locking pad as provided for each of the push rods of the tuner mechanism.

A respective locking pad 172 of the form shown in FIG. 11 is nested on each of the push rods 114 between the projections 168, 170 from the legs 156, 158 and the cam 146. The pad 172 is a flat piece of steel having an arcuate edge 174 of the same radius as the arcuate edge portion 148 of the cam 146 and contacting same. An edge of the pad 172 opposite to the arcuate edge 174 is provided with a pair of recesses 176, 178 for receiving the projections 168, 170, respectively.

Figure 12:
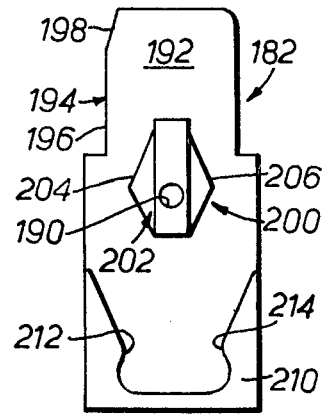
FIG. 12 is an underneath plan view of an upper part of a push button as provided for each of the push rods of the tuner mechanism; and, FIG. 13 is a side view of the upper push button part shown in FIG. 12.
Figure 13:
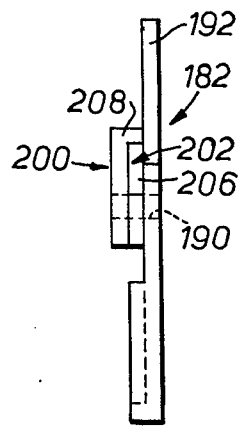

Push buttons 180 (FIGS. 1 to 3) are fitted to the outer ends of all of the push rods 114. Each push button 180 comprises an upper part 182 of the form shown in FIGS. 12 and 13 and a lower part 184 (FIG. 2). The two parts 182, 184 of each push button 180 are secured together and to the associated push rod 114 by a countersunk screw 186 which extends upwardly through a clearance hole 188 in the lower part 184 and is threaded into a tapped hole 190 in the upper part 182.

The upper part 182 of the push button is of a generally flat form and has a portion 192 of reduced width at its inner end. On side edge 194 of the portion 192 is tapered, gradually along a region 196 and more pronouncedly along a region 198, for a reason explained hereinbelow.

A projection 200 depends from the lower surface of the upper part 182. The projection comprises a lozenge-like upper part 202 having a pair of opposed abutment surfaces 204, 206; and an elongate lower part 208 of width appropriate to allow it to be slid along within the slot 118 in the push rod 114. When the push button 180 is assembled, the lower part 208 of the projection lies in the slot 118 and abuts the lower part 184 of the button.

The thickness of the upper part 182 is increased in a region 210 adjacent its outer end to define a second pair of abutment surfaces 212, 214.

The tuner mechanism also includes a clutch arrangement which includes a clutch bar 216, the above-mentioned clutch lever 64 and a clutch tension spring 218. As best seen in FIG. 1, the clutch bar 216 extends along the tuner mechanism, parallel to the connecting strip 88. The clutch bar 216 is guided for limited axial movement by a stud 220 extending from the lower plate 12 into an axial slot 222 in one end of the bar and by at least one other like stud and slot arrangement (not shown).

Along its front edge the clutch bar 216 is provided with a respective recess for each of the push buttons 180. The recess for the extreme right hand push button 180 is shown in FIG. 1 at 224.

The manner in which the tuner mechanism described above is set up to provide selective push-button tuning of an associated radio will now be described. The tuning spindle 36 is rotated till the radio is tuned to the required frequency. During such tuning, the connecting strip 88 and all of the link members 92 are moved by the crank 48 to positions which are uniquely characteristic of the position of the carriage 24 necessary to tune the radio to the required frequency. Suppose now that the tuner mechanism is to be set up so that, in future, operation of the extreme left-hand push button 180 will automatically tune the receiver to the station to which it has just been tuned by means of the tuning spindle. The push rod 114 mounting the push button 180 is in its outer, rest position, as depicted in FIG. 1; and the push button is positioned as shown in dotted outline in FIG. 1. In this position of the push button 180, the free ends 160, 162 of the resilient legs are pinched between the abutment surfaces 212, 214. This causes the legs to tend to rotate towards one another, whereby the projections 168, 170 tend to rotate towards the locking pad 172 to move the latter towards the cam 146. The legs are so constructed and the spacing between the surfaces 212, 214 so arranged that the legs cannot rotate to the extent they would if the locking pad 172 were not present. Consequently, spring forces are developed in the legs which result in the projections 168, 170 being firmly urged against the locking pad 172 whereby the pad is in turn firmly urged against the cam 146, thereby locking the cam against rotation.

To enable the required effect to be obtained, the cam 146 must be made free to rotate. This is done by pulling the push button 180 outwardly until it reaches an outer position determined by the lower part 208 of the projection 200 from the upper part 182 of the push button contacting the outer end of the slot 113 in the push rod 114. The position then adopted by the push button is slightly further out than that shown in dotted outline in FIG. 1 for the button adjacent the extreme left hand button. In the outer position, the free ends of the legs are no longer trapped between the surfaces 212, 214 and the force causing the locking pad 172 to clamp the cam 146 against rotation is removed: the cam is then free to rotate.

During outward movement of the push button 180, the projections 164, 166 are forced past the apices of the abutment surfaces 204, 206. The studs 132, 134 prevent the legs rotating apart sufficiently to allow the projections to pass the apices without resilient deformation of the legs.

The cam 146 having been freed, the push button 180 is then pushed inwardly. Immediately or substantially immediately, the inner flanks of the surfaces 204, 206 contact the projections 164, 166. Due to the studs 132, 134, further inward movement of the push button 180 with respect to the push rod 114 is opposed by the spring forces developed by the resultant resilient deformation of the legs. These forces are arranged to be greater than the outward bias on the push rod resulting from extension of the spring 140, with the consequence that the push button 180 and the push rod 114 maintain their relative position and move inwardly together under the influence of manual pressure on the push button.

Eventually, one of the shoulders 150, 152 on the cam 146 will contact one of the shoulders 102, 104 on the link member 92. Since the cam 146 is free to rotate, further inward movement of the push button 180 and push rod 114 will be accommodated by the cam rotating until both pairs of shoulders are in contact, i.e. until the cam 146 adopts an orientation exactly corresponding to that of the link member 92. Once this stage has been reached, the push rod 114 can travel no further inwardly since the link member 92 is free for pivotal rotation only. Consequently, further pressure on the push button 180 causes the push button to move inwardly with respect to the push rod till the rod and button return to the relative disposition they had prior to the initial pulling out of the button. The consequence of this is that the cam 146 is locked in a fresh position which corresponds to that of the link member 92.

If the push button 180 is then pushed in once more, and assuming that a different frequency has meanwhile been selected, the cam 146, now locked in position, will rotate the link member 92 till the member adopts a position corresponding to that of the cam, in a manner exactly analogous to that in which the link member set the position of the cam when the cam was free to rotate. Pivoting of the link member is transmitted to the carriage 24 via the connecting strip 88, the crank 48 and the tie bar 50, whereby the radio receiver is automatically tuned to the selected frequency.

Due to the fact that the mechanism associated with the tuning spindle 36 provides a moderate resistance to rotation of the spindle to facilitate fine tuning, and since there is a high velocity ratio between the movement of the friction cone 40 and the drive wheel 42, it is desirable that the drive between the cone and wheel be interrupted whenever a push button 180 is pressed, both to avoid too great a force having to be exerted on the button and to avoid excessive stress being applied to the transmission means. The above-described clutch arrangement ensures that this object is achieved. As soon as a push button 180 is depressed, the tapered edge 194 of the upper part 182 thereof contacts an edge of the associated recess 224 in the clutch bar and moves the bar, and also the clutch lever 64 connected to the bar, slightly to the right. Referring to FIG. 3, the lug 62 projecting from the clutch lever 64 is therefore moved out of contact with the collar 66, whereby the drive wheel 42, mounted on the shaft 54, is no longer urged upwardly against the friction cone 40. Thus, as the friction cone 40 and the drive wheel 42 are no longer urged together, rotation of the drive wheel 42, which occurs when the button is eventually fully depressed, is not transmitted to the cone.

When the tuner mechanism is intended for use with a radio receiver having more than one frequency band, the tuner mechanism may be provided with means for switching the radio from one band to another in accordance with the push button depressed. For example, a wavechange bar (not shown) may be mounted at the rear of the tuner mechanism for axial sliding movement parallel to the axis of the connecting strip 88. The wavechange bar interacts with the rearmost ends of the push rods such that the bar is caused to adopt a first position corresponding to a first waveband if a predetermined one or more of the buttons is pushed, and a second position corresponding to a second waveband if the remaining button or buttons is or are pushed.

The tuner mechanism may also be provided with means for indicating the frequency selected, for example a conventional pointer and scale, the pointer being appropriately coupled for movement with the transmission means or the connecting strip 88.

As can best be seen from FIG. 3, by virtue of the way in which the tuner mechanism is constructed the height H of the major part thereof is very small, being several times smaller than the height of the known tuner mechanism described hereinabove. It is therefore possible to accommodate further apparatus, for example a tape player, above the tuner mechanism, the height of the combined unit being no greater than that prescribed by the appropriate DIN specification. Alternatively, the push button arrangement can be double stacked to give a 10 button capability.

The tuner mechanism has been described with reference for use in conjunction with a radio receiver. It should be appreciated, however, that is can be used in association with any form of electronic apparatus where push-button spot frequency selection may be required, for example a radio transmitter or an oscillator.

I claim:

1. A tuner mechanism comprising at least one reactance element, manually operable tuning control means, transmission means interconnecting said reactance element and said tuning control means whererby the reactance of the element is varied by operation of the tuning control means, a movable member connected to said transmission means and adapted to be translationally moved by operation of said tuning control means, at least one actuating member means guiding said actuating member for movement towards and away from said movable member, planar cam means associated with said actuating member, means coplanar with said cam means arranged to adjust the orientation of said cam means, said cam means being adapted to interact with said movable member on movement of said actuating member towards the movable member to translationally move the movable member to a position determined by the orientation of the cam means, and a clamping member, extending within the plane of said cam means, arranged to clamp the cam means in said predetermined orientation.

2. A tuner mechanism according to claim 1, wherein said movable member is flat and including means guiding said movable member for substantially rectilinear translational movement.

3. A tuner mechanism according to claim 2, wherein said movable member is an elongate strip guided for substantially rectilinear movement along its longitudinal axis.

4. A tuner mechanism according to claim 3, wherein said actuating member is flat and substantially coplanar with said movable member.

5. A tuner mechanism according to claim 2, wherein said means guiding said actuating member is adapted for rectilinear movement of the actuating member towards and away from said movable member in a direction substantially perpendicular to the direction of rectilinear movement of the movable member.

6. A tuner mechanism according to claim 1, including a link member, means pivoting one end of said link member to said movable member and means pivoting the other end of said link member to a fixed part of the tuner mechanism, said other end of said link member being provided with an abutment surface adapted to be contacted by said cam means on inward movement of said actuating member, said contact causing said link member to pivot about said other end thereof till the link member adopts a position determined by the orientation of said cam means.

7. A tuner mechanism according to claim 6, wherein said other end of said link member is provided with a pair of said abutment surfaces, one on each side of the position where it is pivoted to said fixed part of the tuner mechanism, and said cam means is provided with a pair of surfaces each adapted to contact a respective one of said pair of abutment surface of said link member.

8. A tuner mechanism according to claim 6, said movable member is flat and including means guiding said movable member for substantially rectilinear translational movement, and wherein both said cam means and said link member are flat and substantially coplanar with said movable member.

9. A tuner mechanism according to claim 8, wherein said movable member is an elongate strip guided for substantially rectilinear movement along its longitudinal axis.

10. A tuner mechanism according to claim 9, wherein said actuating member is flat and substantially coplanar with said movable member.

11. A tuner mechanism according to claim 1, wherein said cam means comprises a cam member and means pivoting said cam member to said actuating member whereby rotation of the cam member about its pivotal axis changes the orientation of the cam means, and wherein said means for adjusting the orientation of said cam means comprises a push button located at the end of said actuating member remote from said movable member and having a pair of abutment surfaces thereon, a pair of resilient legs, means pivoting said legs to said actuating member at positions remote from said end thereof and extending along the actuating member for contact with said abutment surfaces, and a locking member arranged between said cam member and said resilient legs, said push button being adapted for movement with respect to said actuating member, by pulling the button, between a rest position in which free ends of said legs are urged together by said pair of abutment surfaces whereby said locking member is urged by said legs against said cam member to lock said cam member against rotation, and a second position in which said legs are not urged together by said pair of abutment surfaces whereby said locking member is not urged against said cam member so that the cam member may be rotated.

12. A tuner mechanism according to claim 1, wherein a plurality of said actuating members are spaced apart along the direction of translational movement of said movable member.

13. A tuner mechanism according to claim 1, wherein said reactance element is a coil having a ferromagnetic core adapted to be moved into or out of said coil by said transmission means in response to operation of said manually operable tuning control means.

14. A tuner mechanism comprising at least one reactance element, manually operable tuning control means, transmission means interconnecting said reactance element and said tuning control means whereby the reactance of the element is varied by operation of the tuning control means, a movable member connected to said transmission means and adapted to be translationally moved by operation of said tuning control means, at least one actuating member, means guiding said actuating member for movement towards and away from said movable member, cam means associated with said actuating member, means for adjusting the orientation of said cam means, said cam means being adapted to intereact with said movable member on movement of said actuating member towards the movable member to translationally move the movable member to a position determined by the orientation of the cam means, a link member, means pivoting one end of said link member to said movable member, means pivoting the other end of said link member to a fixed part of the tuner mechanism, said other end of said link member being provided with a pair of abutment surfaces, one on each side of the position where said link member is pivoted to said fixed part of the tuner mechanism, and said cam means being provided with a pair of surfaces each adapted to contact a respective one of said pair of abutment surfaces of said link member on inward movement of said actuating member, said contact causing said link member to pivot about said other end thereof till the link member adopts a position determined by the orientation of said cam means.

15. A tuner mechanism comprising at least one reactance element, manually operable tuning control means, transmission means interconnecting said reactance element and said tuning control means whereby the reactance of the element is varied by operation of the tuning control means, a movable member connected to said transmission means and adapted to be translationally moved by operation of said tuning control means, at least one actuating member, means guiding said actuating member for movement towards and away from said movable member, cam means associated with said actuating member,, means for adjusting the orientation of said cam means, said cam means being adapted to interact with said movable member on movement of said actuating member towards the movable member to translationally move the movable member to a position determined by the orientation of the cam means, said cam means comprising a cam member and means pivoting said cam member to said actuating member whereby rotation of the cam member about its pivotal changes the orientation of the cam means, said means for adjusting the orientation of said cam means comprising a push button located at the end of said actuating member remote from said movable member and having a pair of abutment surfaces thereon, a pair of resilient legs, means pivoting said legs to said actuating member at positions remote from said end thereof and extending along the actuating member for contact with said abutment surfaces, and a locking member arranged between said cam member and said resilient legs,, said push button being adapted for movement with respect to said actuating member, by pulling the bottom, between a rest position in which free ends of said legs are urged together by said pair of abutment surfaces whereby said locking member is urged by said legs against said cam member to lock said cam member against rotation, and a second position in which said legs are not urged together by said pair of abutment surfaces whereby said locking member is not urged against said cam member so that the cam member may be rotated.

* * * * *